United States Patent
Iwama

(10) Patent No.: US 9,516,787 B2
(45) Date of Patent: Dec. 6, 2016

(54) COOLING DEVICE WITH TEMPERATURE SENSOR FAILURE DETECTION

(71) Applicant: NEC Computertechno, Ltd., Yamanashi (JP)

(72) Inventor: Hideo Iwama, Yamanashi (JP)

(73) Assignee: NEC Platforms, Ltd., Kawasaki-Shi, Kanagawa (JP)

( * ) Notice: Subject to any disclaimer, the term of this patent is extended or adjusted under 35 U.S.C. 154(b) by 544 days.

(21) Appl. No.: 14/030,723

(22) Filed: Sep. 18, 2013

(65) Prior Publication Data

US 2014/0076513 A1 Mar. 20, 2014

(30) Foreign Application Priority Data

Sep. 19, 2012 (JP) .................................. 2012-205860

(51) Int. Cl.
*B60H 1/00* (2006.01)
*F28F 27/00* (2006.01)
(Continued)

(52) U.S. Cl.
CPC ........... *H05K 7/20209* (2013.01); *G06F 1/206* (2013.01); *Y02B 60/1275* (2013.01)

(58) Field of Classification Search
CPC ..... H05K 7/2089; H05K 7/20209; G06F 1/20; G06F 1/206; Y02B 60/12; Y02B 60/1275
(Continued)

(56) References Cited

U.S. PATENT DOCUMENTS 6,072,397 A 6/2000 Ostrowski
9,207,732 B1 * 12/2015 Chen .................... G06F 1/206
(Continued)

FOREIGN PATENT DOCUMENTS

JP 9-250489 9/1997
JP 2005-274353 10/2005
(Continued)

OTHER PUBLICATIONS

Japanese Office Action mailed Jun. 7, 2016, by the Japanese Patent Office in counterpart Japanese Patent Application No. 2012-205860.

*Primary Examiner* — Len Tran
*Assistant Examiner* — Claire Rojohn, III
(74) *Attorney, Agent, or Firm* — Finnegan, Henderson, Farabow, Garrett & Dunner LLP

(57) ABSTRACT

Disclosed is a cooling device which can perform cooling with suppressed power consumption and noise even when temperature sensor is in failure without increasing cost.
The cooling device includes a temperature estimation unit which, if a failure is detected in at least one of heat source temperature sensors (HSTSs) measuring temperature of the heat sources (HSs), estimates a value to have been measured by the failed HSTS based on measured values by the HSTSs not in failure, a measured value by an exhaust temperature sensor measuring an exhaust temperature which is temperature of an air outlet for discharging heat generated by HSs from a housing containing the HSs, and information representing a temperature distribution characteristic within the housing; and a rotational frequency calculation unit which calculates a rotational frequency of a cooling fan which rotates based on the estimated value and the measured values by the HSTSs not in failure.

4 Claims, 7 Drawing Sheets

(51) Int. Cl.
  *G05D 23/00*   (2006.01)
  *H05K 7/20*    (2006.01)
  *G06F 1/20*    (2006.01)

(58) Field of Classification Search
  USPC .............................. 165/11.1, 200, 287, 288
  See application file for complete search history.

(56) References Cited

U.S. PATENT DOCUMENTS

| | | | | |
|---|---|---|---|---|
| 2007/0101191 A1* | 5/2007 | Iwama | ................ | G06F 11/0712 |
| | | | | 714/15 |
| 2011/0205258 A1* | 8/2011 | Suminoe | .............. | G09G 3/3406 |
| | | | | 345/690 |
| 2013/0250505 A1* | 9/2013 | Makley | ..................... | G06F 1/20 |
| | | | | 361/679.31 |
| 2014/0036443 A1* | 2/2014 | Xu | .......................... | G06F 1/206 |
| | | | | 361/695 |

FOREIGN PATENT DOCUMENTS

| | | | | |
|---|---|---|---|---|
| JP | 2007-226617 | | 9/2007 | |
| JP | 2007226617 | * | 9/2007 | ......... H05K 7/20209 |
| JP | 2011-209146 | | 10/2011 | |
| WO | WO 2010-041500 | | 4/2010 | |

* cited by examiner

Fig. 5

TEMPERATURE DISTRIBUTION TABLE

|  | TEMPERATURE OF CPU 11 | TEMPERATURE OF CPU 12 | TEMPERATURE OF CPU 13 | TEMPERATURE OF IO CONTROLLER 14 | EXHAUST TEMPERATURE |
|---|---|---|---|---|---|
| RECORD 1 | 65°C | 65°C | 70°C | 75°C | 70°C |
| RECORD 2 | 66°C | 65°C | 71°C | 76°C | 71°C |
| RECORD 3 | 67°C | 65°C | 71°C | 76°C | 71°C |
| ... | ... | ... | ... | ... | ... |

COOLING DEVICE WITH TEMPERATURE SENSOR FAILURE DETECTION

This application is based upon and claims the benefit of priority from Japanese Patent Application No. 2012-205860, filed on Sep. 19, 2012, the disclosure of which is incorporated herein in its entirety by reference.

TECHNICAL FIELD

The present invention relates to a cooling device, an electronic apparatus and a cooling method.

BACKGROUND ART

An electronic apparatus such as a personal computer is equipped with various electronic devices, inside its housing, such as a CPU (Central Processing Unit), a memory and an IO (input/output) controller. Such electronic devices are composed of various electronic components including active elements such as a transistor and passive elements such as a capacitor. These electronic components generate heat when the electronic apparatus is in operation. Because the heat could exert an adverse effect on the performance of the electronic components, it needs to be discharged to an outside of the housing of the electronic apparatus. For the discharge, it is generally conducted to take the outside air into the housing by a cooling fan and thus exhaust the inside air, and thereby discharge the heat.

In an electronic apparatus such as described above, which performs cooling of the inside of its housing by a cooling fan, the temperatures of the electronic devices are monitored, and in accordance with measured temperature values, the rotational frequency of the cooling fan is controlled. That is, a control unit or the like for controlling the rotational frequency of the cooling fan performs control in a manner to increase the rotational frequency of the cooling fan when the temperatures of the electronic devices have risen, and in a manner to decrease the rotational frequency of the cooling fan when the temperatures of the electronic devices have dropped.

For example, Japanese Patent Application Laid-Open No. 2007-226617 discloses a cooling system which prevents excessive cooling operation of a cooling fan in an electronic apparatus. This electronic apparatus controls operation of the cooling fan based on reference set values, which are set in a thermal action table (TAT), when electronic devices inside it are in operation in a load state. Specifically, when the temperature inside of the housing has risen and a temperature value detected by any one of temperature sensors has reached a corresponding one of the reference set values, the electronic apparatus performs control to cause the cooling fan to operate to increase its rotational frequency in accordance with the reference set value. On the other hand, when the temperature inside of the housing has dropped, the electronic apparatus performs control to cause the cooling fan to operate to decrease its rotational frequency in accordance with the reference set value.

Japanese Patent Application Laid-Open No. 2011-209146 discloses an electronic apparatus which can determine presence or absence of a failure of a temperature sensor among a plurality of temperature sensors.

Further, International Patent Publication No. WO/2010/041500 discloses a backlight unit which identifies whether a temperature sensor is in normal or abnormal operation from measured temperature data, and controls the brightness of an LED (Light Emitting Diode) whose temperature is being measured by an abnormal temperature sensor, based on substitutive temperature data, instead of measured temperature data by the abnormal temperature sensor.

In such electronic apparatuses as described above which, by a cooling fan, cool down the temperature inside their housing which is raised by the electronic components' heat generation, there are provided temperature sensors for measuring respective electronic devices, and the rotational frequency of the cooling fan is controlled in accordance with temperatures measured by the temperature sensors. Accordingly, in such electronic apparatuses, if any one of the temperature sensors is in failure, it becomes impossible to appropriately control the rotational frequency of the cooling fan. In such a case, for placing priority to the cooling, it is usually conducted to drive the cooling fan at its maximum rotational frequency.

However, if the cooling fan is driven at its maximum rotational frequency when any one of the temperature sensors is in failure, as mentioned above, it leads to excessive operation of the cooling fan, and thus raises a problem in that unnecessary power consumption is increased and also in that noise is increased.

As a method for solving this problem, duplexing of each of the temperature sensors can be considered. In such a case, because even when one of a duplexed pair of temperature sensors is in failure, a value measured by the other temperature sensor can be acquired, the rotational frequency of the cooling fan can be controlled appropriately. However, the duplexing of temperature sensors causes increase in cost.

Patent Documents 1 and 2 disclose nothing about a measure to deal with failure of a temperature sensor. In the technology disclosed in Patent Document 3, when a failure is detected in a temperature sensor, a value measured by a temperature sensor neighboring the abnormal temperature sensor is employed as substitutive data. However, because the neighboring temperature sensor measures the temperature of a different heat source, it cannot be said to be an appropriate substitute for the temperature sensor having detected the failure.

SUMMARY

The present invention has been made in view of the above-described problem, and an object of the present invention is to provide a cooling device, an electronic apparatus and a cooling method which can perform cooling with suppressed power consumption and noise even when any one of temperature sensors is in failure, without increasing cost.

A cooling device according to an exemplary aspect of the invention includes a temperature estimation unit which, if a failure is detected in at least any one of a plurality of heat source temperature sensors measuring temperature of respective ones of a plurality of heat sources, estimates a temperature value to have been measured by the failed heat source temperature sensor, based on measured values by the heat source temperature sensors not in failure, a measured value by an exhaust temperature sensor measuring an exhaust temperature which is temperature of an air outlet for discharging heat generated by the plurality of heat sources from a housing containing the plurality of heat sources, and information representing a temperature distribution characteristic within the housing; and a rotational frequency calculation unit which calculates a rotational frequency of a cooling fan which rotates in the housing, based on the estimated temperature value and the measured values by the heat source temperature sensors not in failure.

An electronic apparatus according to an exemplary aspect of the invention includes a plurality of heat source temperature sensors which measure the temperature of respective ones of a plurality of heat sources; an exhaust temperature sensor which measures an exhaust temperature, which is temperature of an air outlet for discharging heat generated by the plurality of heat sources from a housing containing the plurality of heat sources; information representing a temperature distribution characteristic within the housing; a temperature estimation unit which, if a failure is detected in at least any one of the heat source temperature sensors, estimates a temperature value to have been measured by the failed heat source temperature sensor, based on measured values by the heat source temperature sensors not in failure, a measured value by the exhaust temperature sensor measuring an exhaust temperature and the information representing a temperature distribution characteristic; and a rotational frequency calculation unit which calculates a rotational frequency of a cooling fan rotating in the housing, based on the temperature value estimated by the temperature estimation unit and the measured values by the heat source temperature sensors not in failure.

A cooling method according to an exemplary aspect of the invention includes, if a failure is detected, by a temperature estimation unit, on at least any one of a plurality of heat source temperature sensors measuring temperature of respective ones of a plurality of heat sources, estimating a temperature value to have been measured by the failed heat source temperature sensor, based on measured values by the heat source temperature sensors not in failure, a measured value by an exhaust temperature sensor measuring an exhaust temperature which is temperature of an air outlet for discharging heat generated by the plurality of heat sources from a housing containing the plurality of heat sources, and information representing a temperature distribution characteristic within the housing; and calculating, by a rotational frequency calculation unit, a rotational frequency of a cooling fan which rotates in the housing, based on the estimated temperature value and the measured values by the heat source temperature sensors not in failure.

According to the present invention, achieved is the effect that it is possible to provide a cooling device, an electronic apparatus and a cooling method which can perform cooling with suppressed power consumption and noise even when any one of temperature sensors is in failure, without increasing cost.

BRIEF DESCRIPTION OF THE DRAWINGS

Exemplary features and advantages of the present invention will become apparent from the following detailed description when taken with the accompanying drawings in which:

FIG. 5 is a diagram showing an example of a temperature distribution table included in the electronic apparatus according to the first exemplary embodiment of the present invention.

EXEMPLARY EMBODIMENT

First Exemplary Embodiment

A first exemplary embodiment of the present invention will be described in detail with reference to drawings.

Figure 1:
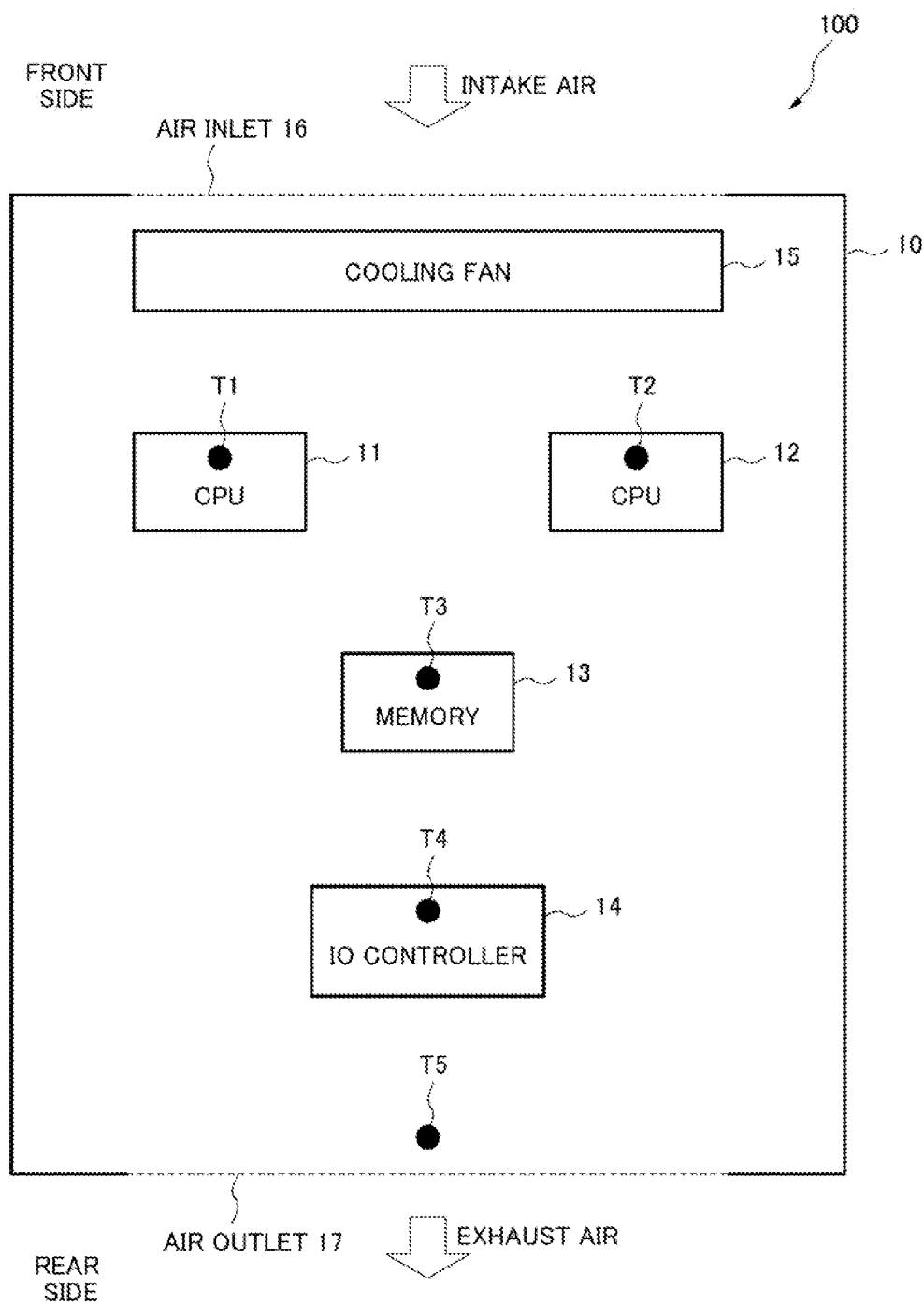
FIG. 1 is a schematic configuration diagram of an electronic apparatus according to a first exemplary embodiment of the present invention.

FIG. 1 is a schematic configuration diagram of an electronic apparatus 100 according to the first exemplary embodiment of the present invention. As shown in FIG. 1, the electronic apparatus 100 includes, within a housing 10, a CPU 11, a CPU 12, a memory 13, an IO (Input/Output) controller 14 and a cooling fan 15.

The electronic apparatus 100 further includes an air inlet 16 on the front side of the housing 10 and an air outlet 17 on the rear side. The electronic apparatus 100 includes the cooling fan 15 on the front side of the housing 10. The CPUs 11 and 12, the memory 13 and the IO controller 14 generate heat when the electronic apparatus 100 is in operation. By the cooling fan 15 rotating and thereby taking in the outside air from the air inlet 16 and exhausting warmed air within the housing 10 from the air outlet 17, the electronic apparatus 100 cools down the inside of the housing 10.

The CPU 11, the CPU 12, the memory 13 and the IO controller 14 includes temperature sensors T1, T2, T3 and T4, respectively, which measure the temperatures of the respective components. The housing 10 includes an exhaust temperature sensor T5 which measures the temperature of the air outlet 17, in the vicinity of the exhaust outlet 17. The exhaust temperature sensor T5 may be located at anywhere it can detect the temperature of the air outlet 17, not limited to be located in the vicinity of the exhaust outlet 17.

Figure 2:
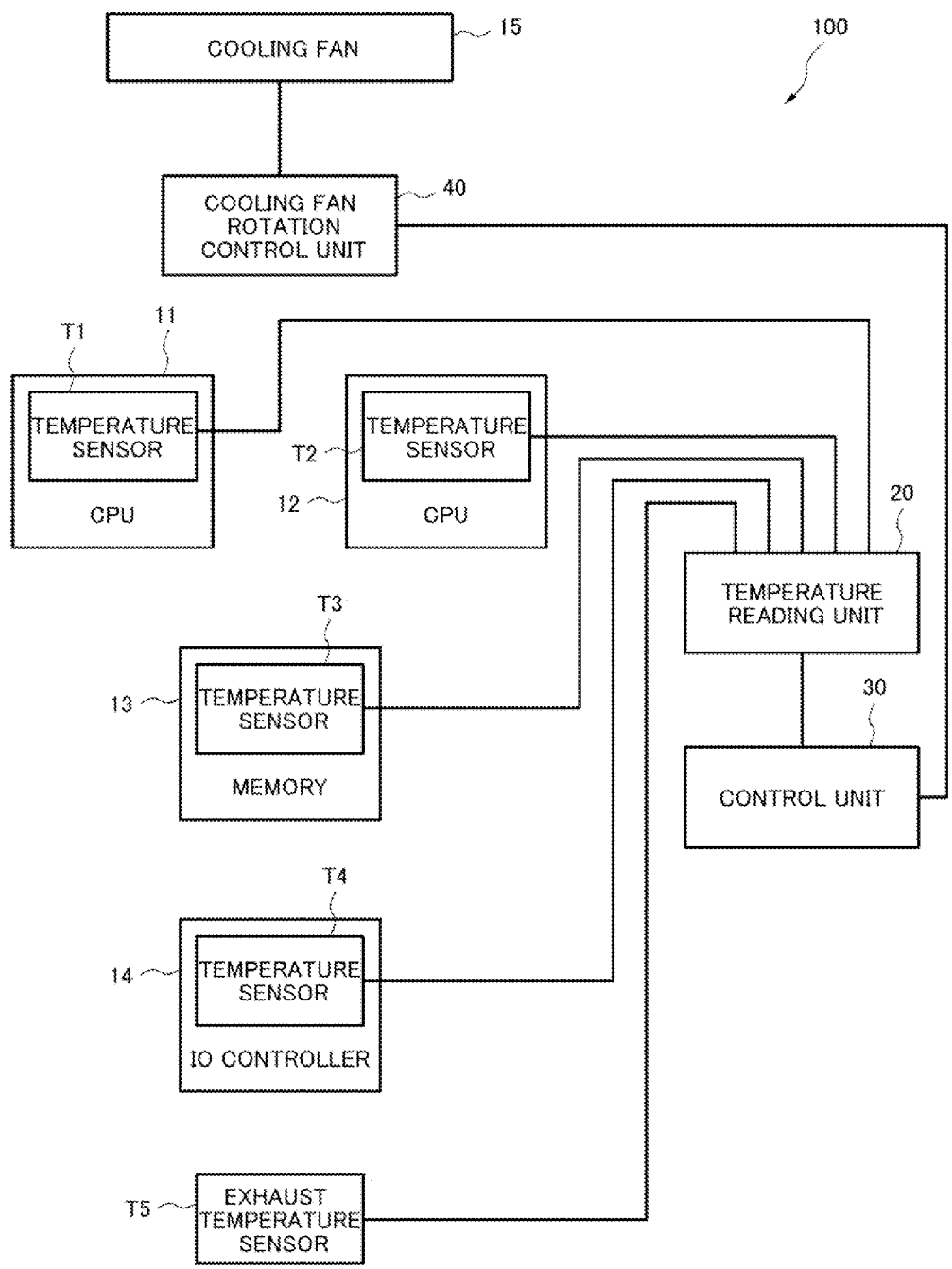
FIG. 2 is a block diagram showing electronic components and their control circuit, which are included in the electronic apparatus according to the first exemplary embodiment of the present invention.

FIG. 2 is a block diagram showing electronic components and their control circuit, which are included in the electronic apparatus 100 according to the first exemplary embodiment of the present invention. As shown in FIG. 2, the electronic apparatus 100 includes a temperature reading unit 20, a control unit 30 and a cooling fan rotation control unit 40, in addition to the electronic components shown in FIG. 1.

The temperature reading unit 20 reads values indicated by the heat source temperature sensors T1, T2, T3 and T4 and by the exhaust temperature sensor T5. On the basis of the values read by the temperature reading unit 20, the control unit 30 calculates a rotational frequency of the cooling fan 15. The cooling fan rotation control unit 40 controls the cooling fan 15 to rotate at the rotational frequency calculated by the control unit 30.

Figure 3:
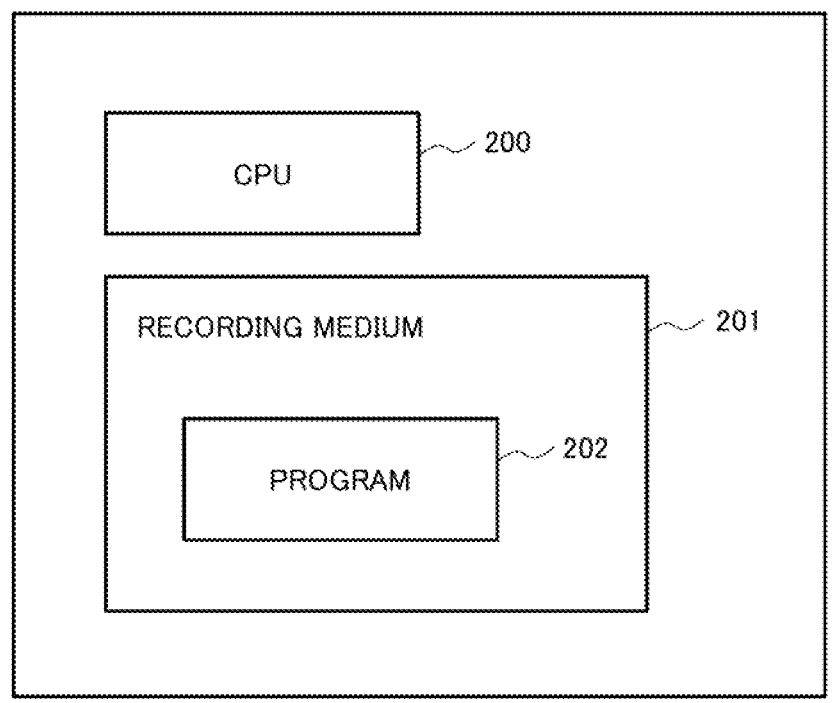
FIG. 3 is a diagram showing a hardware configuration of the electronic apparatus according to the first exemplary embodiment of the present invention.

When the temperature reading unit 20, the control unit 30 and the cooling fan rotation control unit 40, of the electronic apparatus 100 shown in FIG. 2, are realized by a computer, they have a hardware configuration shown in FIG. 3 as an example.

The configuration shown in FIG. 3 includes a CPU 200, a recording medium 201 such as a memory and a program 202 stored in the recording medium 201. By executing various software programs (computer programs), the CPU 200 manages overall operation of the electronic apparatus 100. In the present exemplary embodiment and another exemplary embodiment which will be described later, the CPU 200 executes software programs for respective ones of functions (units) held by the electronic apparatus 100, which will be described below, referring properly to the recording medium 201 such as a memory.

More specifically, referring properly to the recording medium 201 such as a memory, the CPU 200 executes software programs for performing the functions of the temperature reading unit 20, the control unit 30 and the cooling fan rotation control unit 40, which are included in the electronic apparatus 100, and thereby implements each of the functions.

Figure 4:
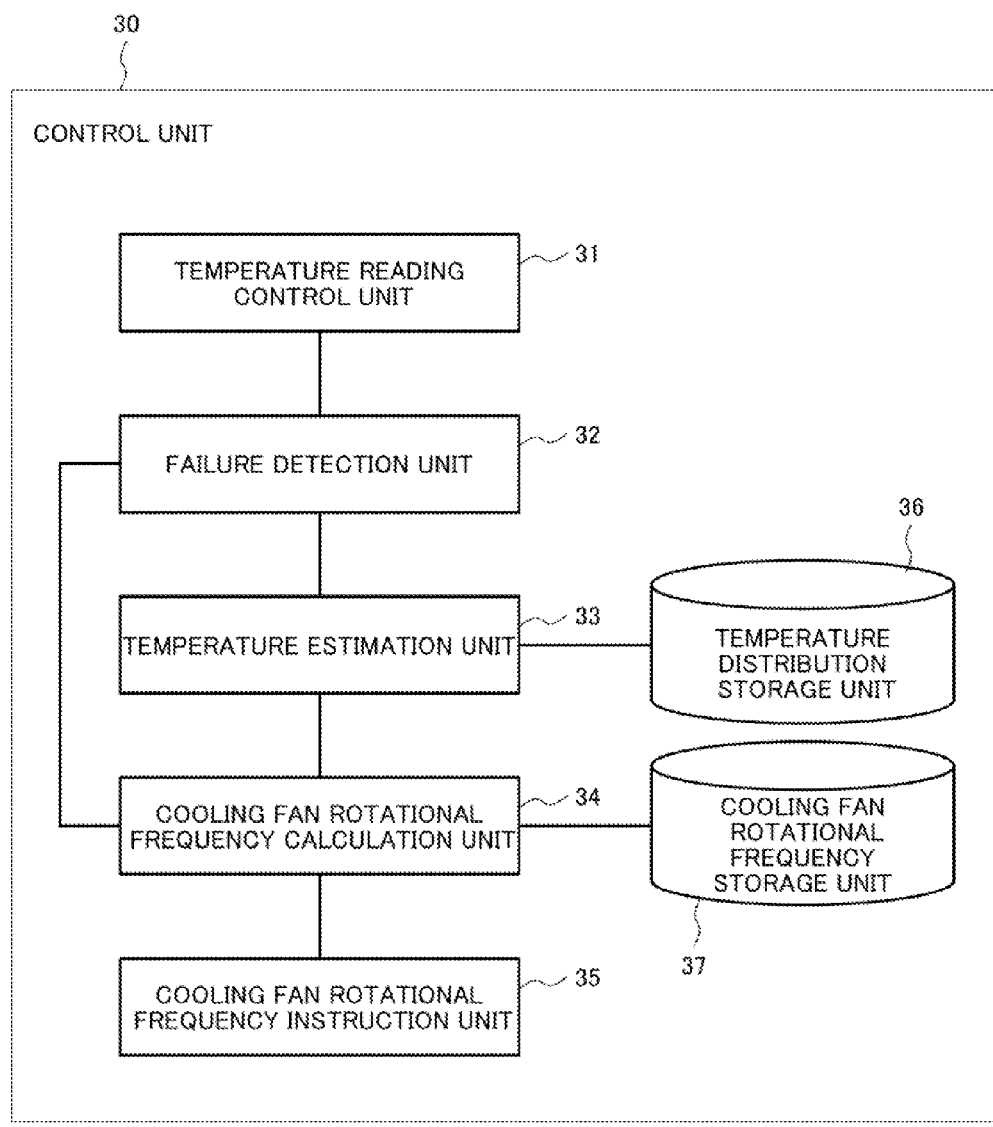
FIG. 4 is a block diagram showing a configuration of a control unit included in the electronic apparatus according to the first exemplary embodiment of the present invention.

FIG. 4 is a block diagram showing a specific configuration of the control unit 30 included in the electronic apparatus 100 according to the first exemplary embodiment of the present invention. As shown in FIG. 3, the control unit 30 includes a temperature reading control unit 31, a failure detection unit 32, a temperature estimation unit 33, a cooling fan rotational frequency calculation unit 34, a cooling fan rotational frequency instruction unit 35, a temperature distribution storage unit 36 and a cooling fan rotational frequency storage unit 37.

The temperature reading control unit 31 periodically instructs to the temperature reading unit 20 to read respective values of the temperature sensors T1, T2, T3 and T4 and of the exhaust temperature sensor T5, and acquires results of their reading. On the basis of the values acquired by the temperature reading control unit 31, in case a failure occurs in any one of the temperature sensors T1, T2, T3 and T4, the failure detection unit 32 detects the failure. The temperature estimation unit 33 estimates a value to have been measured by the temperature sensor in failure, referring to a temperature distribution table (its detail will be described later) stored in the temperature distribution storage unit 36.

On the basis of the values acquired from the temperature reading unit 20 and the value estimated by the temperature estimation unit 33, the cooling fan rotational frequency calculation unit 34 calculates an optimum rotational frequency of the cooling fan 15 for cooling down the inside of the housing 10, referring to a cooling fan rotational frequency table (not illustrated in the drawings) stored in the cooling fan rotational frequency storage unit 37. The cooling fan rotational frequency instruction unit 35 notifies the cooling fan rotation control unit 40 of the rotational frequency calculated by the cooling fan rotational frequency calculation unit 34.

FIG. 5 is a diagram showing an example of a temperature distribution table, which is stored in the temperature distribution storage unit 36 included in the electronic apparatus 100 according to the first exemplary embodiment of the present invention. The temperature distribution table includes information representing a temperature distribution characteristic within the housing. As shown in FIG. 5, the temperature distribution table includes results of measurement in advance of the temperatures of the respective heat sources, that is, the CPUs 11 and 12, the memory 13 and the IO controller 14, and of the exhaust temperature. There is a correlation among the temperatures of the respective heat sources and the exhaust temperature. Accordingly, when a temperature sensor for measuring a certain heat source is in failure, the temperature of the heat source can be estimated based on measured values in advance of the temperatures of the respective heat sources and of the exhaust temperature. Instead of such temperature values actually measured in advance, temperature values obtained by work out calculation on paper may be stored in the temperature distribution table.

For example, when the temperature sensor T1 for the CPU 11 is in failure, the temperature estimation unit 33 estimates the temperature of the CPU 11 based on measured values by the temperature sensors T2, T3, T4 and T5 and values stored in the temperature distribution table. When measured values by the temperature sensors T2, T3, T4 and T5 are 65° C., 70° C., 75° C. and 70° C., respectively, referring to a temperature distribution table shown in FIG. 5, it is noticed that record 1 corresponds to this case. Accordingly, in this case, the temperature estimation unit 33 determines the CPU 11's temperature value to be 65° C. In such cases where the temperature sensor T1 for the CPU 11 is in failure and there exist two or more pieces of record which are identical in terms of temperature values except for that for the CPU 11 (as the case of record 2 and record 3 in FIG. 5), the temperature estimation unit 33 may employ record indicating a higher value for the temperature of the CPU 11 (the record 3 in the case in FIG. 5).

In this way, the temperature estimation unit 33 extracts from the temperature distribution table a record which includes temperature values related to the CPU 12, the memory 13, the IO controller 14 and exhaust temperature are the same values as the measured values by T2, T3, T4 and T5. The temperature estimation unit 33 determines the temperature value to have been measured by T1 to be the temperature value related to CPU 11 in the extracted record.

Figure 6:
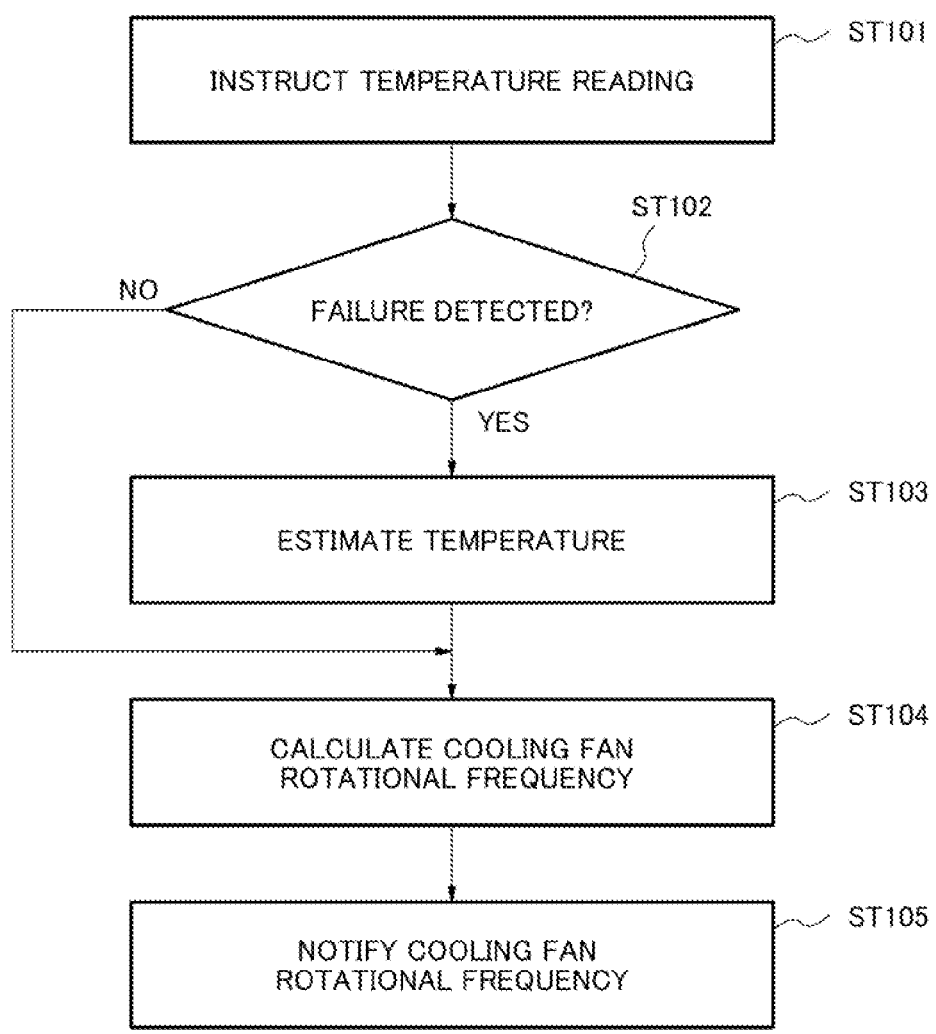
FIG. 6 is a flow chart showing operation of the control unit included in the electronic apparatus according to the first exemplary embodiment of the present invention.

FIG. 6 is a flow chart illustrating operation of the control unit 30 included in the electronic apparatus 100 according to the first exemplary embodiment of the present invention. Referring to FIG. 6, a description will be given of operation of the control unit 30 for calculating a rotational frequency of the cooling fan 15.

The temperature reading control unit 31 periodically instructs the temperature reading unit 20 to read measured values by the temperature sensors T1, T2, T3 and T4 and by the exhaust temperature sensor T5 (step ST101). In response to the instruction, the temperature reading unit 20 reads measured values by the temperature sensors T1, T2, T3 and T4 and by the exhaust temperature sensor T5, and notifies the temperature reading control unit 31 of the read values. The temperature reading control unit 31 notifies the failure detection unit 32 of the received values.

The failure detection unit 32 examines whether any one of the temperature sensors is in failure or not (step ST102). That is, when any one of measured values by the temperature sensors T1, T2, T3 and T4 cannot be detected, the failure detection unit 32 determines the corresponding temperature sensor to be in failure. In such a state, the failure detection unit 32 notifies the temperature estimation unit 33 of information indicating which one of the temperature sensors is in failure and of the temperature values having been successfully acquired. If detecting no failure, the failure detection unit 32 notifies the cooling fan rotational frequency calculation unit 34 of the acquired temperature values. Here, when the exhaust temperature sensor is in failure, the cooling fan rotational frequency calculation unit 34 can calculate an optimum rotational frequency of the cooling fan 15 based on successfully acquired values measured by the temperature sensors T1 to T4. Therefore, in such a case, the failure detection unit 32 notifies the cooling fan rotational frequency calculation unit 34 of the successfully acquired values measured by the temperature sensors T1 to T4.

Receiving the information on a temperature sensor in failure (hereafter, referred to as a failed temperature sensor), the temperature estimation unit 33 estimates a value to have been measured by the failed temperature sensor by referring to a temperature distribution table (step ST103). For example, when a failed temperature sensor is the temperature sensor T1 for measuring the temperature of the CPU 11 and measured values by the other temperature sensors T2, T3, T4 and T5 are 65° C., 71° C., 76° C. and 71° C., respectively, the temperature estimation unit 33 estimates a value to have been measured by the temperature sensor T1 to be 67° C. by referring to the temperature distribution table. If not all of the acquired temperature values are equal to respective ones of the temperature values which are related to the respective heat sources in the temperature distribution table, the temperature estimation unit 33 may employ a record holding the nearest temperature values. Alternatively, the temperature estimation unit 33 may employ a record, in the temperature distribution table, which gives the largest number of coincidences between the acquired temperature values and the temperature values related to the respective heat sources in the temperature distribution table.

The temperature estimation unit 33 notifies the cooling fan rotational frequency calculation unit 34 of the temperature value thus estimated and the temperature values having been successfully acquired as described above. On the basis of the thus received temperature values and a cooling fan rotational frequency table stored in the cooling fan rotational frequency storage unit 37, the cooling fan rotational frequency calculation unit 34 calculates a value of the rotational frequency of the cooling fan, such as to be 1200 RPM (rotation per minute) or the like, which is optimal for cooling down the inside of the housing 10 (step ST104).

The cooling fan rotational frequency table is a set of tables for the respective heat sources which each relate various temperature values of the corresponding heat source to optimum rotational frequencies of the cooling fan for respective cases of the temperature values. Here, the cooling fan rotational frequency table includes a table which relates various temperature values of the CPU 11 to optimum rotational frequencies of the cooling fan for respective cases of the temperature values. Similarly, the cooling fan rotational frequency table includes tables with respect to the CPU 12, the memory 13 and the IO controller. The cooling fan rotational frequency calculation unit 34 reads from each of the tables an optimum rotational frequency of the cooling fan for the case of the acquired temperature value with respect to the corresponding heat source, and employs the highest rotational frequency value among the read rotational frequencies as a rotational frequency of the cooling fan 15.

The cooling fan rotational frequency calculation unit 34 notifies the cooling fan rotational frequency instruction unit 35 of the rotational frequency calculated as above. The cooling fan rotational frequency instruction unit 35 instructs the cooling fan rotation control unit 40 to perform control for causing the cooling fan to rotate at the acquired rotational frequency (step ST105). On the basis of the instruction, the cooling fan rotation control unit 40 controls the cooling fan 15 to rotate at the acquired rotational frequency.

As has been described above, according to the first exemplary embodiment, the temperature reading control unit 31 acquires measured values by respective ones of the temperature sensors T1, T2, T3 and T4 and by the exhaust temperature sensor T5, and, in case any one of the temperature sensors is in failure, the failure detection unit 32 detects the failure. If a failure is detected, the temperature estimation unit 33 estimates a value to have been measured by the failed temperature sensor based on measured values by temperature sensors from which the values have been successfully acquired and a measured value by the exhaust temperature sensor, referring to the temperature distribution table stored in advance. On the basis of the measured values by the temperature sensors from which the values have been successfully acquired and the measured value by the exhaust temperature sensor, the cooling fan rotational frequency calculation unit 34 calculates a rotational frequency of the cooling fan which is optimal for cooling down the inside of the housing 10, referring to the cooling fan rotational frequency table. With this configuration, according to the first exemplary embodiment, even without duplexing the temperature sensors for measuring the temperatures of the heat sources, it is possible, in case any one of the temperature sensors is in failure, to estimate a temperature to have been measured by the failed temperature sensor, and as a result, achieved is the effect that, even in such a case where any one of the temperature sensors is in failure, cooling operation with suppressed power consumption and noise can be performed without increasing cost.

In another exemplary embodiment, the failure detection unit 32 may detect not only a failure on a single temperature sensor but also a plurality to of failures on a plurality of temperature sensors. Also in such a case, the temperature estimation unit 33 estimates values to have been measured by the failed temperature sensors based on measured values by temperature sensors from which the values have been successfully acquired and a measured value by the exhaust temperature sensor, referring to the temperature distribution table stored in advance.

Second Exemplary Embodiment

Figure 7:
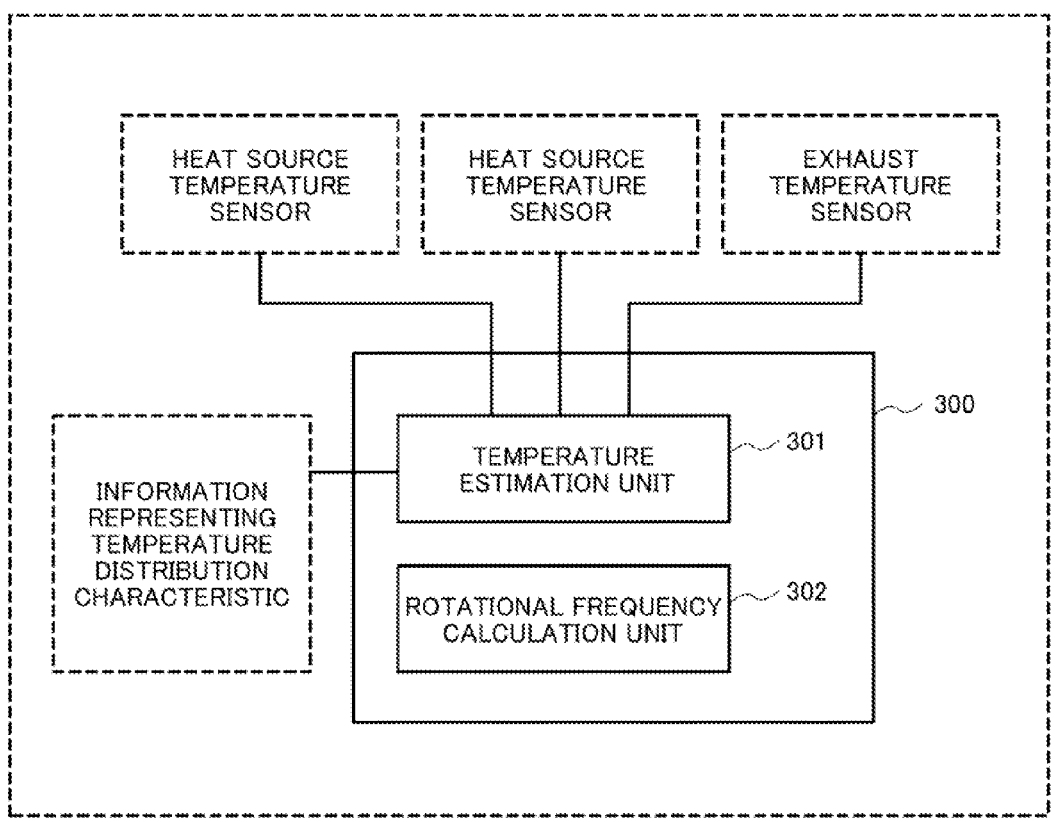
FIG. 7 is a block diagram showing a configuration of a cooling device according to a second exemplary embodiment of the present invention.

FIG. 7 is a block diagram showing a configuration of a cooling device 300 according to a second exemplary embodiment of the present invention. As shown in FIG. 7, the cooling device 300 includes a temperature estimation unit 301 and a rotational frequency calculation unit 302.

If a failure is detected in at least any one of a plurality of heat source temperature sensors for measuring the temperatures of respective ones of a plurality of heat sources, the temperature estimation unit 301 estimates a temperature value to have been measured by the failed heat source temperature sensor, based on measured values by the heat source temperature sensors not in failure, a measured value by an exhaust temperature sensor for measuring an exhaust temperature, which is the temperature of an air outlet for discharging heat generated by the plurality of heat sources from a housing containing the plurality of heat sources, and information representing a temperature distribution characteristic within the housing.

The rotational frequency calculation unit 302 calculates a rotational frequency of a cooling fan which rotates in the housing, based on the estimated value and the measured values by the heat source temperature sensors not in failure.

Thus, according to the second exemplary embodiment, the cooling device 300 has the above-described configuration, and accordingly, obtained is the effect that, even in case any one of the temperature sensors is in failure, cooling operation with suppressed power consumption and noise can be performed without increasing cost.

In the exemplary embodiments described above, descriptions have been given of the case where the CPU 200 shown in FIG. 3 executes the functions of the temperature reading unit 20, the control unit 30 and the cooling fan rotation control unit 40, of the electronic apparatus 100, which are shown in FIGS. 2 and 4, as an example of a case of realizing the functions by a software program. However, part or whole of the functions represented by respective blocks shown in FIGS. 2 and 4 may be realized as hardware.

The present invention, which have been described taking the above-described exemplary embodiments as examples, may be accomplished by providing the above-described electronic apparatus 100 with a computer program capable of realizing the functions of the flow chart (FIG. 6) referred to in the descriptions, and by subsequently reading the computer program into the CPU 200 and executing it there.

The provided computer program may be stored in a computer-readable storage device such as a readable/writable memory (temporary recording medium) or a hard disk device. Then, in such a case, the present invention can be regarded as being constituted by such a recording medium storing a code representing such a computer program or the computer program itself.

INDUSTRIAL APPLICABILITY

The present invention can be applied to, for example, a personal computer, a server device and the like, which cool down the inside of their housing by a cooling fan.

Part or whole of the above-described exemplary embodiments may be described also as the following supplementary notes, but it is not limited to the following ones.

(Supplementary note 1) A cooling device including: a temperature estimation unit which, if a failure is detected in at least any one of a plurality of heat source temperature sensors measuring temperature of respective ones of a plurality of heat sources, estimates a temperature value to have been measured by the failed heat source temperature sensor, based on measured values by the heat source temperature sensors not in failure, a measured value by an exhaust temperature sensor measuring an exhaust temperature which is temperature of an air outlet for discharging heat generated by the plurality of heat sources from a housing containing the plurality of heat sources, and information representing a temperature distribution characteristic within the housing; and a rotational frequency calculation unit which calculates a rotational frequency of a cooling fan which rotates in the housing, based on the estimated temperature value and the measured values by the heat source temperature sensors not in failure.

(Supplementary note 2) The cooling device according to Supplementary note 1, wherein: the information representing the temperature distribution characteristic includes temperature values of respective ones of the heat source temperature sensors and of the exhaust temperature sensor which were measured in advance or derived by calculation; and the temperature estimation unit extracts, from the information representing the temperature distribution characteristic, a record which includes temperature values of respective ones of the heat source temperature sensors and the temperature value of the exhaust temperature sensor are the same values as the measured values by the heat source temperature sensors not in failure and the measured value by the exhaust temperature sensor, and determines the estimated temperature value to be the temperature value related to the failed heat source temperature sensor in the extracted record.

(Supplementary note 3) The cooling device according to Supplementary note 1, wherein, if a plurality of failures are detected in the plurality of heat source temperature sensors, the temperature estimation unit estimates the temperature values to have been measured by respective ones of the failed heat source temperature sensors, based on measured values by the heat source temperature sensors not in failure, a measured value by the exhaust temperature sensor measuring an exhaust temperature and the information representing the temperature distribution characteristic within the housing.

(Supplementary note 4) An electronic apparatus including: a plurality of heat source temperature sensors which measure temperature of respective ones of a plurality of heat sources; an exhaust temperature sensor which measures an exhaust temperature, which is temperature of an air outlet for discharging heat generated by the plurality of heat sources from a housing containing the plurality of heat sources; information representing a temperature distribution characteristic within the housing; a temperature estimation unit which, if a failure is detected in at least any one of the heat source temperature sensors, estimates a temperature value to have been measured by the failed heat source temperature sensor, based on measured values by the heat source temperature sensors not in failure, a measured value by the exhaust temperature sensor measuring an exhaust temperature and the information representing a temperature distribution characteristic; and a rotational frequency calculation unit which calculates a rotational frequency of a cooling fan rotating in the housing, based on the temperature value estimated by the temperature estimation unit and the measured values by the heat source temperature sensors not in failure.

(Supplementary note 5) The electronic apparatus according to Supplementary note 4, wherein: the information representing the temperature distribution characteristic includes temperature values of respective ones of the heat source temperature sensors and of the exhaust temperature sensor which were measured in advance or derived by calculation; and the temperature estimation unit extracts, from the information representing a temperature distribution characteristic, a record which includes temperature values of respective ones of the heat source temperature sensors and the temperature value of the exhaust temperature sensor are the same values as the measured values by the heat source temperature sensors not in failure and the measured value by the exhaust temperature sensor, and determines the estimated temperature value to be the temperature value related to the failed heat source temperature sensor in the extracted record.

(Supplementary note 6) A cooling method including: if a failure is detected, by a temperature estimation unit, on at least any one of a plurality of heat source temperature sensors measuring temperature of respective ones of a plurality of heat sources, estimating a temperature value to have been measured by the failed heat source temperature sensor, based on measured values by the heat source temperature sensors not in failure, a measured value by an exhaust temperature sensor measuring an exhaust temperature which is temperature of an air outlet for discharging heat generated by the plurality of heat sources from a housing containing the plurality of heat sources, and information representing a temperature distribution characteristic within the housing; and calculating, by a rotational frequency calculation unit, a rotational frequency of a cooling fan which rotates in the housing, based on the estimated temperature value and the measured values by the heat source temperature sensors not in failure.

(Supplementary note 7) The cooling method according to Supplementary note 6, wherein, in the estimating of the temperature value to have been measured by the failed heat source temperature sensor, the temperature estimation unit extracts, from the information representing the temperature distribution characteristic which includes temperature values of respective ones of the heat source temperature sensors and of the exhaust temperature sensor which were measured in advance or derived by calculation, a record which includes temperature values of respective ones of the heat source temperature sensors and the temperature value of the exhaust temperature sensor are the same values as the measured values by the heat source temperature sensors not in failure and the measured value by the exhaust temperature sensor, and determines the estimated temperature value to be the temperature value related to the failed heat source temperature sensor in the extracted record.

(Supplementary note 8) A non-transitory computer-readable storage medium storing a cooling program for causing a computer to execute:

a process of, if a failure is detected in at least any one of a plurality of heat source temperature sensors measuring temperature of respective ones of a plurality of heat sources, estimating a temperature value to have been measured by the failed heat source temperature sensor, based on measured values by the heat source temperature sensors not in failure, a measured value by an exhaust temperature sensor for measuring an exhaust temperature which is temperature of an air outlet for discharging heat generated by the plurality of heat sources from a housing containing the plurality of heat sources, and information representing a temperature distribution characteristic within the housing; and a process of calculating a rotational frequency of a cooling fan which rotates in the housing, based on the estimated temperature value and the measured values by the heat source temperature sensors not in failure.

(Supplementary note 9) The non-transitory computer-readable storage medium storing a cooling program according to supplementary note 8 causing a computer to further execute:

a process of, in the estimating of the temperature value to have been measured by the failed heat source temperature sensor, extracting, from the information representing the temperature distribution characteristic which includes temperature values of respective ones of the heat source temperature sensors and of the exhaust temperature sensor which were measured in advance or derived by calculation, a record which includes temperature values of respective ones of the heat source temperature sensors and the temperature value of the exhaust temperature sensor are the same values as the measured values by the heat source temperature sensors not in failure and the measured value by the exhaust temperature sensor, and determining the estimated temperature value to be the temperature value related to the failed heat source temperature sensor in the extracted record.

(Supplementary note 10) A cooling device including: a temperature estimation means for, if a failure is detected in at least any one of a plurality of heat source temperature sensors measuring temperature of respective ones of a plurality of heat sources, estimating a temperature value to have been measured by the failed heat source temperature sensor, based on measured values by the heat source temperature sensors not in failure, a measured value by an exhaust temperature sensor measuring an exhaust temperature which is temperature of an air outlet for discharging heat generated by the plurality of heat sources from a housing containing the plurality of heat sources, and information representing a temperature distribution characteristic within the housing; and a rotational frequency calculation means for calculating a rotational frequency of a cooling fan which rotates in the housing, based on the estimated temperature value and the measured values by the heat source temperature sensors not in failure.

(Supplementary note 11) The cooling device according to Supplementary note 10, wherein:

the information representing the temperature distribution characteristic includes temperature values of respective ones of the heat source temperature sensors and of the exhaust temperature sensor which were measured in advance or derived by calculation; and the temperature estimation means extracts, from the information representing the temperature distribution characteristic, a record which includes temperature values of respective ones of the heat source temperature sensors and the temperature value of the exhaust temperature sensor are the same values as the measured values by the heat source temperature sensors not in failure and the measured value by the exhaust temperature sensor, and determines the estimated temperature value to be the temperature value related to the failed heat source temperature sensor in the extracted record.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

REFERENCE SIGNS LIST 10 housing
11, 12 CPU
13 memory
14 IO controller
15 cooling fan
16 air inlet
17 air outlet
20 temperature reading unit
30 control unit
31 temperature reading control unit
32 failure detection unit
33 temperature estimation unit
34 cooling fan rotational frequency calculation unit
35 cooling fan rotational frequency instruction unit
36 temperature distribution storage unit
37 cooling fan rotational frequency storage unit
40 cooling fan rotation control unit
100 electronic apparatus
T1, T2, T3, T4 temperature sensor
T5 exhaust temperature sensor

The invention claimed is:

1. A cooling device comprising:
a memory storing instructions;
a processor configured to execute the instructions to:
obtain measured temperature values generated by a plurality of heat source temperature sensors and an exhaust temperature sensor, wherein:
the plurality of heat source temperature sensors are configured to measure temperatures of a plurality of heat sources contained in a housing, and the exhaust temperature sensor is configured to measure an exhaust temperature which is a temperature of an air outlet for discharging heat generated by the plurality of heat sources;

when detecting a heat source temperature sensor has failed, access information representing a temperature distribution characteristic within the housing, wherein the information includes predetermined temperature values of the plurality of heat source temperature sensors and the exhaust temperature sensor, the predetermined temperature values being measured in advance or derived by calculation;

extract, from the information representing the temperature distribution characteristic, a record including:
predetermined temperature values which are the same as, or nearest to, the measured temperature values generated by heat source temperature sensors not in failure and the exhaust temperature sensor, and
a corresponding predetermined temperature value of the failed heat source temperature sensor;

determine an estimated temperature value of the failed heat source temperature sensor to be the corresponding predetermined temperature value in the record; and calculate a rotational frequency of a cooling fan which rotates in the housing, based on the estimated temperature value of the failed heat source temperature sensor and the measured values generated by the heat source temperature sensors not in failure.

2. The cooling device according to claim 1, wherein the processor is further configured to execute the instructions to:
when more than one of the plurality of heat source temperature sensors have failed, estimating temperature values of the failed heat source temperature sensors, based on the measured values of the heat source temperature sensors not in failure, the measured value of the exhaust temperature sensor, and the information representing the temperature distribution characteristic within the housing.

3. An electronic apparatus comprising:
a plurality of heat source temperature sensors configured to measure temperatures of a plurality of heat sources contained in a housing;
an exhaust temperature sensor configured to measure an exhaust temperature, which is a temperature of an air outlet for discharging heat generated by the plurality of heat sources;
a memory storing:
information representing a temperature distribution characteristic within the housing, wherein the information includes predetermined temperature values of the plurality of heat source temperature sensors and the exhaust temperature sensor, the predetermined temperature values being measured in advance or derived by calculation; and
instructions; and
a processor configured to execute the instructions to:
obtain measured temperature values generated by the plurality of heat source temperature sensors and the exhaust temperature sensor;
when detecting a heat source temperature sensor has failed, extract, from the information representing the temperature distribution characteristic, a record including:
predetermined temperature values which are the same as, or nearest to, the measured temperature values generated by heat source temperature sensors not in failure and the exhaust temperature sensor, and
a corresponding predetermined temperature value of the failed heat source temperature sensor;
determine an estimated temperature value of the failed heat source temperature sensor to be the corresponding predetermined temperature value in the record; and
calculate a rotational frequency of a cooling fan rotating in the housing, based on the estimated temperature value of the failed heat source temperature sensor and the measured values generated by the heat source temperature sensors not in failure.

4. A cooling method comprising:
obtaining measured temperature values generated by a plurality of heat source temperature sensors and an exhaust temperature sensor, wherein:
the plurality of heat source temperature sensors are configured to measure temperatures of a plurality of heat sources contained in a housing, and
the exhaust temperature sensor is configured to measure an exhaust temperature which is a temperature of an air outlet for discharging heat generated by the plurality of heat sources;
when it is detected that a heat source temperature sensor has failed, accessing information representing a temperature distribution characteristic within the housing, wherein the information includes predetermined temperature values of the plurality of heat source temperature sensors and the exhaust temperature sensor, the predetermined temperature values being measured in advance or derived by calculation;
extracting, from the information representing a temperature distribution characteristic, a record including:
predetermined temperature values which are the same as, or nearest to, the measured temperature values generated by heat source temperature sensors not in failure and the exhaust temperature sensor, and
a corresponding predetermined temperature value of the failed heat source temperature sensor;
determining an estimated temperature value of the failed heat source temperature sensor to be the corresponding predetermined temperature value in the record; and
calculating a rotational frequency of a cooling fan which rotates in the housing, based on the estimated temperature value of the failed heat source temperature sensor and the measured values generated by the heat source temperature sensors not in failure.

* * * * *